US012685120B2

(12) United States Patent
Liang et al.

(10) Patent No.: US 12,685,120 B2
(45) Date of Patent: Jul. 14, 2026

(54) SELF-ALIGNED BACKSIDE CONTACT MODULE FOR 3DIC APPLICATION

(71) Applicant: QUALCOMM Incorporated, San Diego, CA (US)

(72) Inventors: Qingqing Liang, San Diego, CA (US); Periannan Chidambaram, San Diego, CA (US); George Pete Imthurn, San Diego, CA (US); Stanley Seungchul Song, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 713 days.

(21) Appl. No.: 17/933,187

(22) Filed: Sep. 19, 2022

(65) Prior Publication Data

US 2024/0096750 A1 Mar. 21, 2024

(51) Int. Cl.
| | |
|---|---|
| *H10W 20/20* | (2026.01) |
| *H10D 64/23* | (2025.01) |
| *H10D 86/00* | (2025.01) |
| *H10W 10/00* | (2026.01) |
| *H10W 10/17* | (2026.01) |
| *H10W 20/00* | (2026.01) |
| *H10W 20/41* | (2026.01) |

(52) U.S. Cl.
CPC .......... *H10W 20/20* (2026.01); *H10D 64/251* (2025.01); *H10D 86/201* (2025.01); *H10W 10/014* (2026.01); *H10W 10/17* (2026.01); *H10W 20/023* (2026.01); *H10W 20/056* (2026.01); *H10W 20/081* (2026.01); *H10W 20/435* (2026.01)

(58) Field of Classification Search
CPC ............. H01L 23/481; H01L 21/76224; H01L 21/76802; H01L 21/76877; H10W 20/20; H10W 10/014; H10W 10/17; H10D 64/251; H10D 86/201
See application file for complete search history.

(56) References Cited

U.S. PATENT DOCUMENTS

| | | | | | |
|---|---|---|---|---|---|
| 8,138,533 | B2 * | 3/2012 | Koike | .................. | H10F 39/811 257/292 |
| 8,299,583 | B2 * | 10/2012 | Zhu | ...................... | H10W 46/00 438/618 |
| 8,659,152 | B2 * | 2/2014 | Fujita | ................... | H10W 20/20 257/737 |

(Continued)

FOREIGN PATENT DOCUMENTS

| | | | | | |
|---|---|---|---|---|---|
| CN | 109690756 | A | * | 4/2019 | ......... H10W 20/481 |
| CN | 117393535 | A | * | 1/2024 | ........... H10W 20/43 |

(Continued)

OTHER PUBLICATIONS

International Search Report and Written Opinion—PCT/US2023/073452—ISA/EPO—Nov. 13, 2023.

*Primary Examiner* — Laura M Menz
(74) *Attorney, Agent, or Firm* — Muncy, Geissler, Olds & Lowe, P.C.

(57) ABSTRACT

Disclosed are integrated circuit structures with through-substrate vias (TSVs) processed through self-aligned contact modules. As a result, much smaller and/or denser TSVs are formed with low mechanical stress. The denser TSVs allow for more flexible wiring options.

19 Claims, 14 Drawing Sheets

(56) References Cited

U.S. PATENT DOCUMENTS

| | | | | |
|---|---|---|---|---|
| 9,035,460 B2 * | 5/2015 | Matsuura | H10W 20/023 | 257/774 |
| 9,455,187 B1 * | 9/2016 | Gambino | H10P 72/74 | |
| 9,780,136 B2 * | 10/2017 | Kwon | H10F 39/809 | |
| 10,347,564 B2 * | 7/2019 | Lagouge | H10W 20/20 | |
| 11,205,630 B2 * | 12/2021 | Elsherbini | H10D 84/01 | |
| 11,444,067 B2 * | 9/2022 | Fay | H10W 90/00 | |
| 12,414,380 B2 * | 9/2025 | Chuang | H10D 86/201 | |
| 2009/0102021 A1 * | 4/2009 | Chen | H10W 20/023 | 257/621 |
| 2009/0283871 A1 * | 11/2009 | Chang | H10W 90/00 | 257/E21.597 |
| 2010/0140749 A1 * | 6/2010 | Kuo | H10W 42/20 | 257/621 |
| 2010/0155796 A1 * | 6/2010 | Koike | H10F 39/811 | 257/292 |
| 2010/0224876 A1 * | 9/2010 | Zhu | H10W 46/00 | 257/E21.597 |
| 2011/0248404 A1 * | 10/2011 | Chiu | H10W 20/40 | 257/773 |
| 2012/0061827 A1 * | 3/2012 | Fujita | H10W 20/20 | 257/737 |
| 2013/0140709 A1 * | 6/2013 | Matsuura | H10W 20/023 | 257/774 |
| 2014/0367777 A1 * | 12/2014 | Huang | H10D 88/101 | 438/459 |
| 2015/0060967 A1 * | 3/2015 | Yokoyama | H10F 39/18 | 257/295 |
| 2015/0311116 A1 * | 10/2015 | Matsuura | H10W 20/023 | 438/637 |
| 2016/0104676 A1 * | 4/2016 | Huiskamp | H10W 20/42 | 257/774 |
| 2016/0111360 A1 * | 4/2016 | Cho | H10W 42/00 | 257/774 |
| 2017/0053907 A1 * | 2/2017 | Huang | H10D 88/101 | |
| 2017/0092680 A1 * | 3/2017 | Kwon | H10F 39/809 | |
| 2018/0061760 A1 * | 3/2018 | Lou | H10W 20/023 | |
| 2018/0145011 A1 * | 5/2018 | Lin | H10W 20/20 | |
| 2020/0381512 A1 * | 12/2020 | Kao | H10D 30/603 | |
| 2021/0098407 A1 * | 4/2021 | Elsherbini | H10D 84/01 | |
| 2021/0183842 A1 * | 6/2021 | Fay | H10W 90/00 | |
| 2021/0391237 A1 * | 12/2021 | Kao | H10W 20/20 | |
| 2021/0391302 A1 * | 12/2021 | Kao | H10W 20/023 | |
| 2022/0020665 A1 * | 1/2022 | Li | H10W 20/20 | |
| 2023/0005818 A1 * | 1/2023 | Lee | H10W 20/20 | |
| 2023/0420360 A1 * | 12/2023 | Haran | H10W 20/42 | |
| 2024/0096750 A1 * | 3/2024 | Liang | H10W 20/023 | |
| 2024/0096790 A1 * | 3/2024 | Badaroglu | H10D 89/10 | |
| 2025/0029892 A1 * | 1/2025 | Puls | H10W 20/20 | |

FOREIGN PATENT DOCUMENTS

| | | | | | |
|---|---|---|---|---|---|
| CN | 119856278 A | * | 4/2025 | | H10W 20/435 |
| EP | 3007224 A1 | * | 4/2016 | | H10W 20/40 |
| EP | 4300565 A1 | * | 1/2024 | | H10W 20/20 |
| EP | 4529379 A1 | * | 3/2025 | | H10W 20/427 |
| JP | 2011003645 A | * | 1/2011 | | H10W 20/216 |
| JP | 2018148152 A | * | 9/2018 | | H10W 42/00 |
| KR | 20200138640 A | * | 12/2020 | | H10P 50/242 |
| KR | 20220100480 A | * | 7/2022 | | H10W 20/2134 |
| WO | WO-2024064520 A1 | * | 3/2024 | | H10W 20/435 |

* cited by examiner

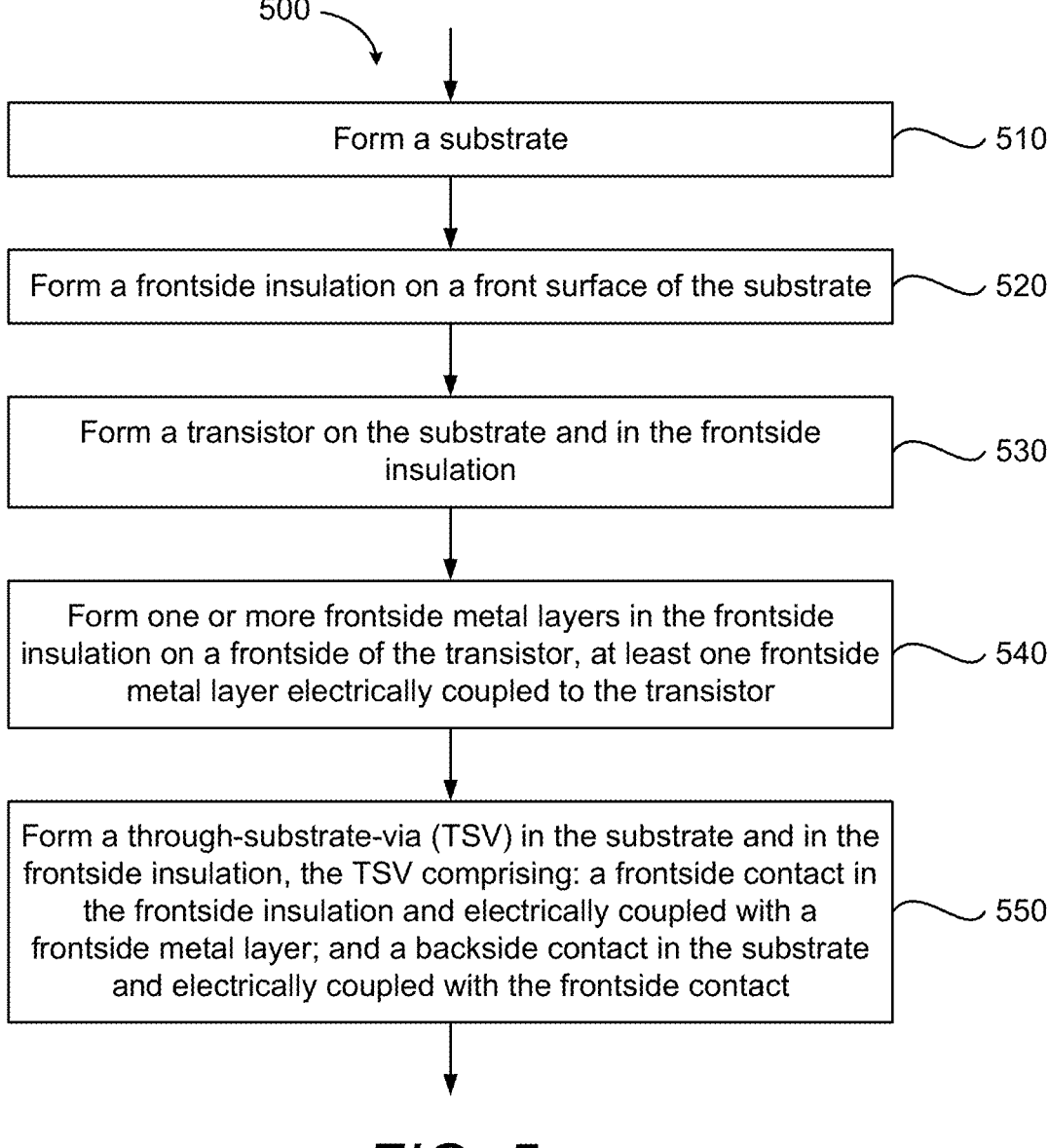

500

| Form a substrate | 510 |

| Form a frontside insulation on a front surface of the substrate | 520 |

| Form a transistor on the substrate and in the frontside insulation | 530 |

| Form one or more frontside metal layers in the frontside insulation on a frontside of the transistor, at least one frontside metal layer electrically coupled to the transistor | 540 |

| Form a through-substrate-via (TSV) in the substrate and in the frontside insulation, the TSV comprising: a frontside contact in the frontside insulation and electrically coupled with a frontside metal layer; and a backside contact in the substrate and electrically coupled with the frontside contact | 550 |

*FIG. 5*

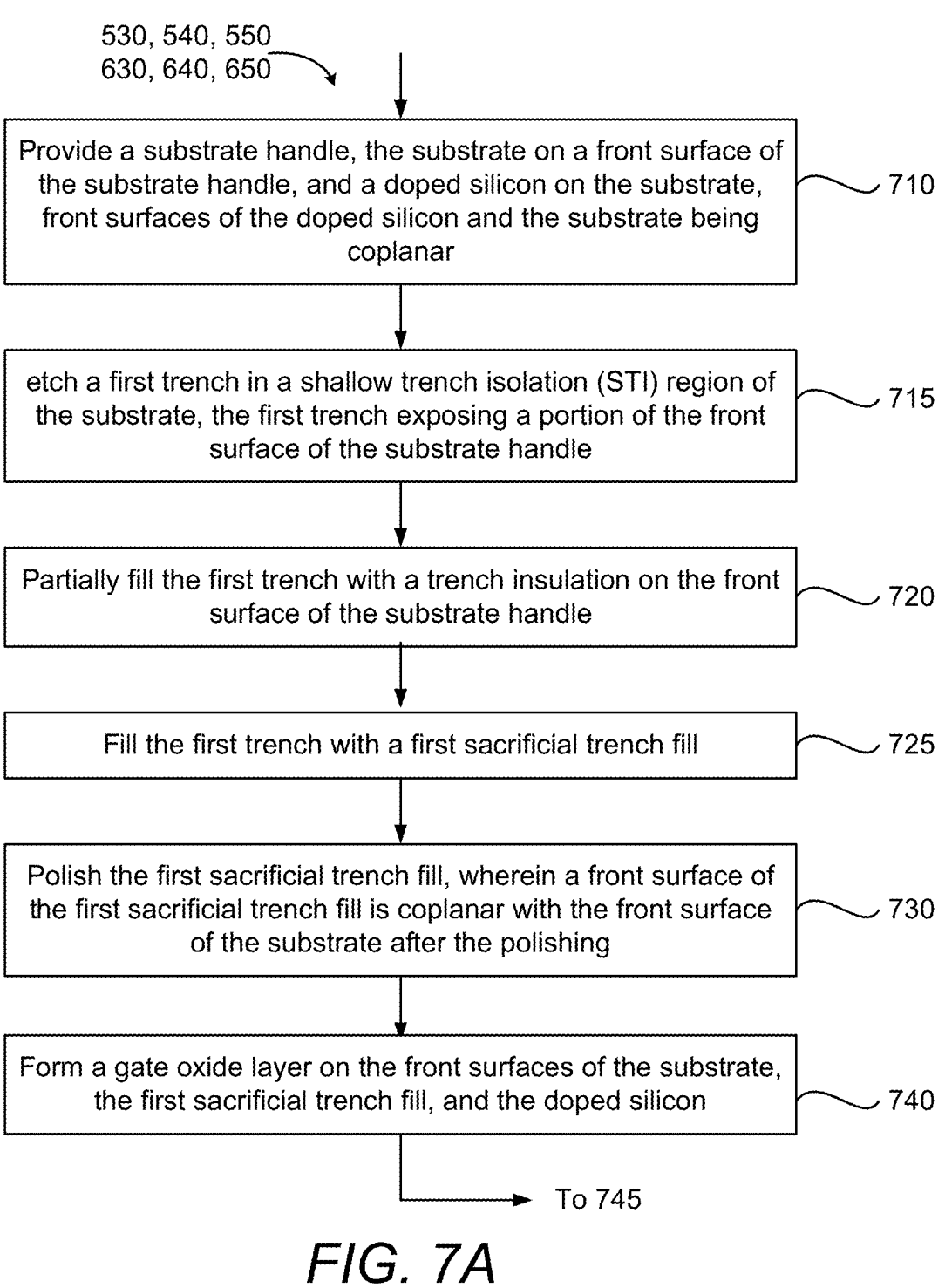

530, 540, 550
630, 640, 650

Provide a substrate handle, the substrate on a front surface of the substrate handle, and a doped silicon on the substrate, front surfaces of the doped silicon and the substrate being coplanar — 710 etch a first trench in a shallow trench isolation (STI) region of the substrate, the first trench exposing a portion of the front surface of the substrate handle — 715

Partially fill the first trench with a trench insulation on the front surface of the substrate handle — 720

Fill the first trench with a first sacrificial trench fill — 725

Polish the first sacrificial trench fill, wherein a front surface of the first sacrificial trench fill is coplanar with the front surface of the substrate after the polishing — 730

Form a gate oxide layer on the front surfaces of the substrate, the first sacrificial trench fill, and the doped silicon — 740

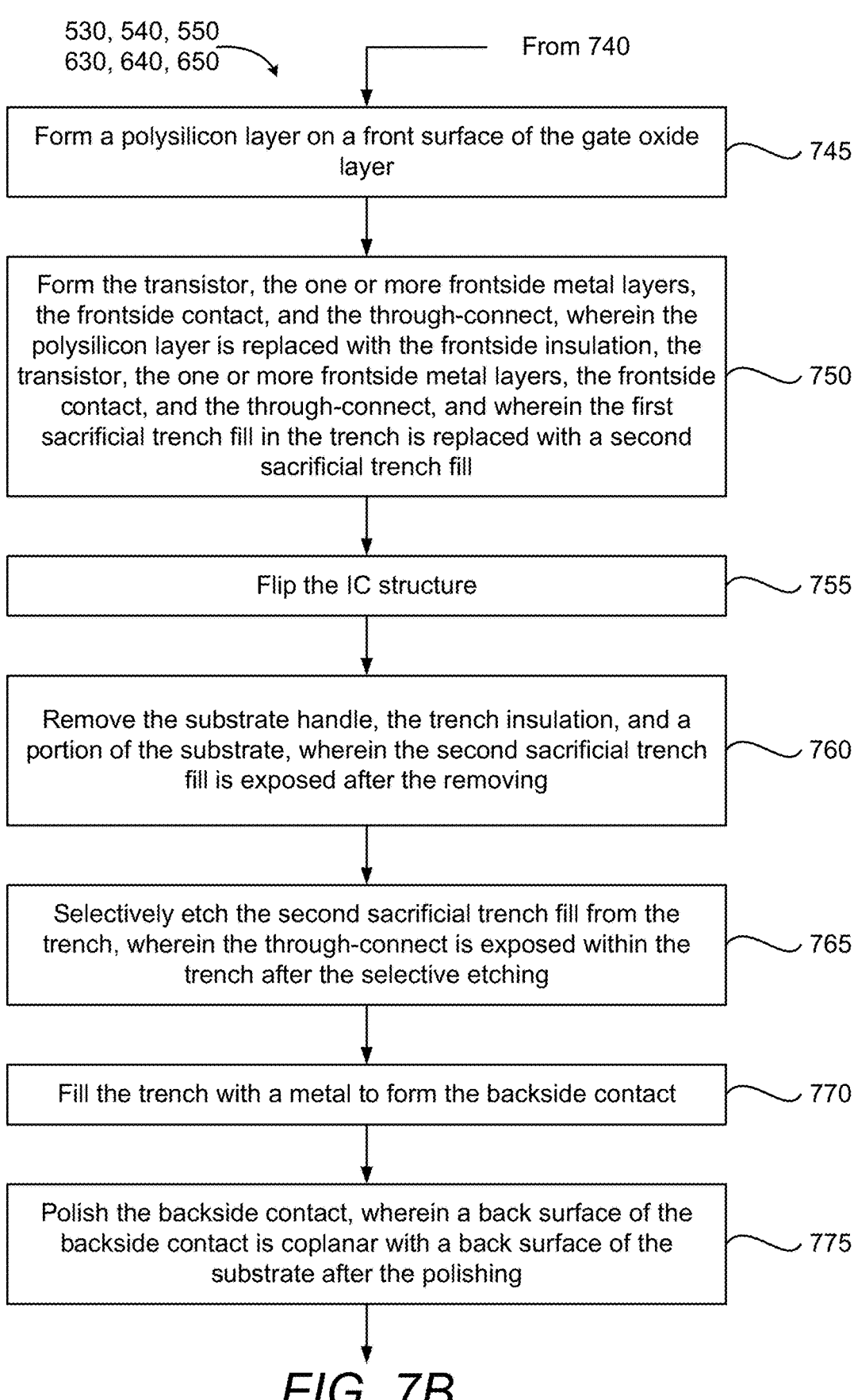

530, 540, 550
630, 640, 650

From 740

Form a polysilicon layer on a front surface of the gate oxide layer — 745

Form the transistor, the one or more frontside metal layers, the frontside contact, and the through-connect, wherein the polysilicon layer is replaced with the frontside insulation, the transistor, the one or more frontside metal layers, the frontside contact, and the through-connect, and wherein the first sacrificial trench fill in the trench is replaced with a second sacrificial trench fill — 750

Flip the IC structure — 755

Remove the substrate handle, the trench insulation, and a portion of the substrate, wherein the second sacrificial trench fill is exposed after the removing — 760

Selectively etch the second sacrificial trench fill from the trench, wherein the through-connect is exposed within the trench after the selective etching — 765

Fill the trench with a metal to form the backside contact — 770

Polish the backside contact, wherein a back surface of the backside contact is coplanar with a back surface of the substrate after the polishing — 775

*FIG. 7B*

SELF-ALIGNED BACKSIDE CONTACT MODULE FOR 3DIC APPLICATION

FIELD OF DISCLOSURE

This disclosure relates generally to novel self-aligned backside contact for three-dimensional integrated circuit (3DIC) applications.

BACKGROUND

Integrated circuit technology has achieved great strides in advancing computing power through miniaturization components such as semiconductor transistors. The progression of semiconductors have progressed from bulk substrates and planar CMOS, FinFETs, nanowires or nanoribbons, FinFET 3D stacking to nanowire or nanoribbon 3D stacking. 3DIC is one of the main trends for very large scale integration (VLSI) devices in the More Moore era. Through-silicon via is an important process module that allows 3D stacking.

Unfortunately, conventional TSVs are limited by size, aspect ratio, mechanical stress, and alignments on the other side. Accordingly, there is a need for systems, apparatus, and methods that enable TSVs to be fabricated that addresses one or more issues of the conventional TSVs and their fabrication.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary integrated circuit (IC) structure is disclosed. The IC structure may comprise a substrate. The IC structure may also comprise a frontside insulation on a front surface of the substrate. The IC structure may further comprise a transistor on the substrate and in the frontside insulation. The IC structure may yet comprise one or more frontside metal layers in the frontside insulation on a frontside of the transistor. At least one frontside metal layer may be electrically coupled to the transistor. The IC structure may yet further comprise a through-substrate-via (TSV) in the substrate and in the frontside insulation. The TSV may comprise a frontside contact in the frontside insulation and electrically coupled with a frontside metal layer. The TSV may also comprise a backside contact in the substrate and electrically coupled with the frontside contact.

An exemplary method of fabricating an integrated circuit (IC) structure is disclosed. The method may comprise forming a substrate. The method may also comprise forming a frontside insulation on a front surface of the substrate. The method may further comprise forming a transistor on the substrate and in the frontside insulation. The method may yet comprise forming one or more frontside metal layers in the frontside insulation on a frontside of the transistor. At least one frontside metal layer may be electrically coupled to the transistor. The method may yet further comprise forming a through-substrate-via (TSV) in the substrate and in the frontside insulation. The TSV may comprise a frontside contact in the frontside insulation and electrically coupled with a frontside metal layer. The TSV may also comprise a backside contact in the substrate and electrically coupled with the frontside contact.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIGS. 5-7B illustrate flow charts of an example method of manufacturing an integrated circuit structure in accordance with one or more aspects of the disclosure.

Figure 1:
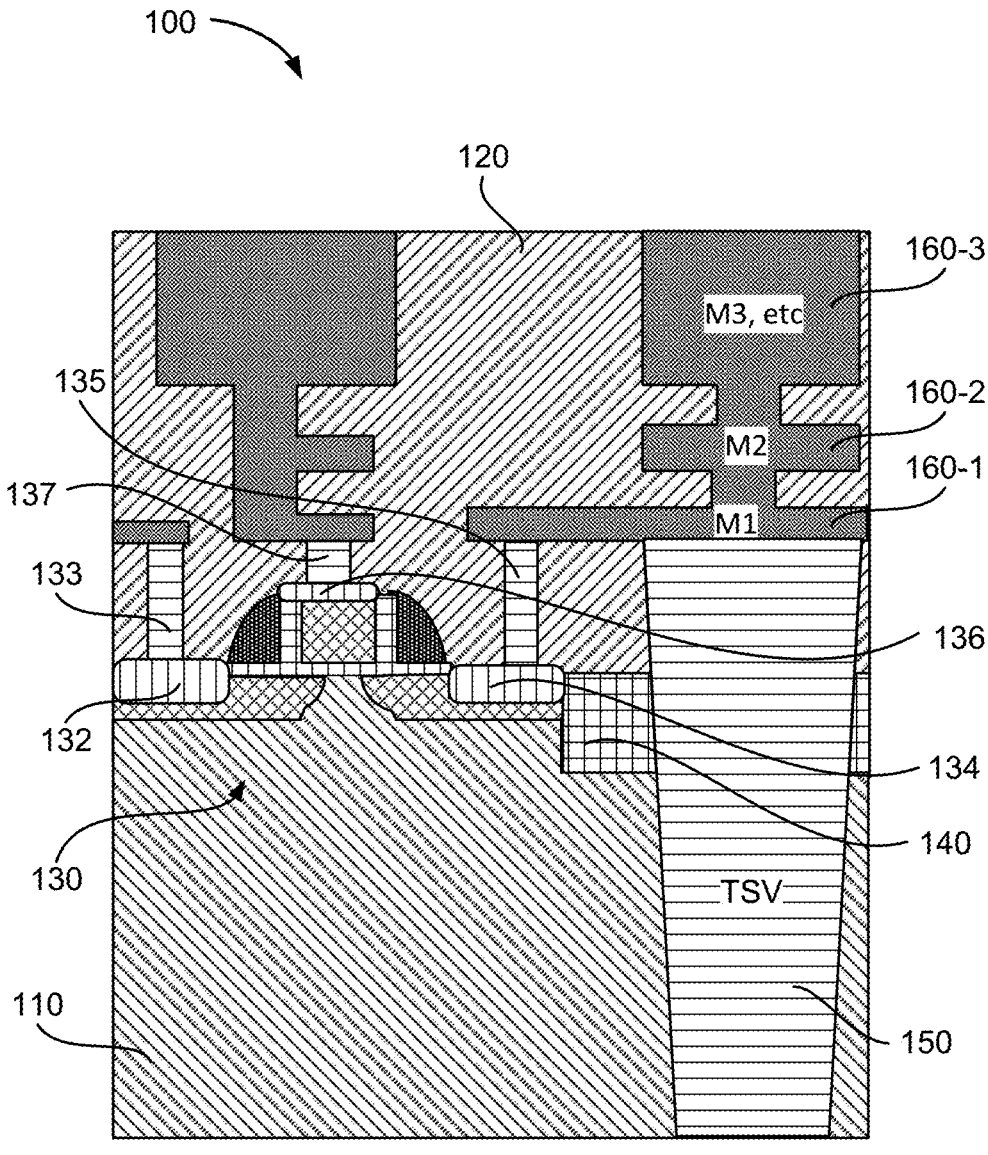
FIG. 1 illustrates an example of a conventional 3DIC.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

As indicated above, TSV can be an important process module that allows 3D stacking in 3DICs to occur. However, conventional TSVs are limited by size, aspect ratio, mechanical stress, and alignments on the other side. FIG. 1 illustrates an example of a conventional 3DIC. The conventional 3DIC 100 is an example illustrating a TSV on a bulk silicon (Si) substrate.

As seen, the conventional 3DIC 100 includes a bulk silicon (Si) substrate 110 and a dielectric 120 on a front surface of the substrate 110. In this instance, the front surface of the substrate 110 is the upper surface. Before proceeding further, it should be noted that terms such as "upper", "lower", "left", "right", etc. are used for convenience, and are not intended to indicate absolute orientation unless explicitly indicated otherwise.

As seen, a transistor 130 is formed in the substrate 110 and in the dielectric 120. A source silicide 132 is in contact with a source of the transistor 130, a drain silicide 134 is in contact with a drain of the transistor 130, and a gate silicide 136 is in contact with a gate of the transistor 130. A source contact 133 is in contact with the source silicide 132, a drain contact 135 is in contact with the drain silicide 134, and a gate contact 137 is in contact with the gate silicide 136.

Metal layers 160-1, 160-2, 160-2 (individually or combination referred to as metal layer(s) 160) are formed in the dielectric 120. In this instance, the first metal layer 160-1 (also referred to as M1) is electrically coupled to the transistor 130 through source, drain, and/or gate contacts 133, 135, 137.

The 3DIC 100 also includes a through-silicon-via 150 formed in the dielectric 120, a shallow trench isolation (STI) 140, and the substrate 110. The STI 140 is in an upper portion of the substrate 110 to isolate the transistor 130. As seen, the through-silicon-via 150 contacts the first metal layer 160-1 and extends through the dielectric 120, the STI 140, and the substrate 110.

The size of the TSV 150 is large. For example, the width and height of the TSV 150 can be ~10 μm and ~150 um, respectively. The large size of the TSV 150 can put stress on nearby devices. Also, the density of the TSVs is reduced due to the large size. This means that the wiring options are limited.

Figure 2:
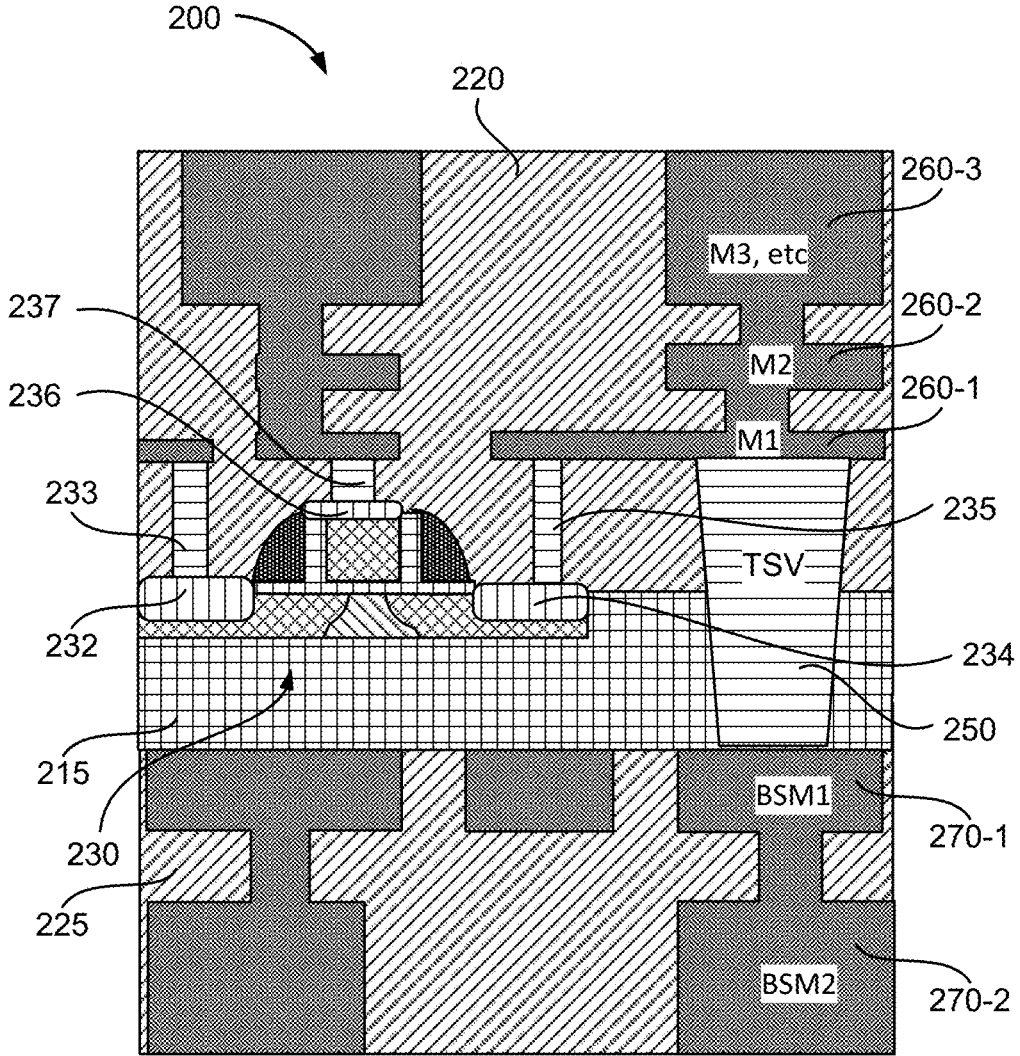
FIG. 2 illustrates another example of a conventional 3DIC.

FIG. 2 illustrates another example of a conventional 3DIC 200, which is an illustration of a TSV on silicon-on-insulator (SOI). As seen, the conventional 3DIC 200 includes buried oxide (BOX) layer 215, a frontside dielectric 220 on a front (upper) surface of the BOX layer 215, and a back dielectric 225 on a back (lower) surface of the BOX layer 215.

As seen, a transistor 230 is formed on the BOX layer 215 and in the frontside dielectric 220. A source silicide 232 is in contact with a source of the transistor 230, a drain silicide 234 is in contact with a drain of the transistor 230, and a gate silicide 236 is in contact with a gate of the transistor 230. A source contact 233 is in contact with the source silicide 232, a drain contact 235 is in contact with the drain silicide 234, and a gate contact 237 is in contact with the gate silicide 236.

Frontside metal layers 260-1, 260-2, 260-2 (individually or combination referred to as frontside metal layer(s) 260) are formed in the frontside dielectric 220. In this instance, the first frontside metal layer 260-1 (also referred to as M1) is electrically coupled to the transistor 230 through source, drain, and/or gate contacts 233, 235, 237.

Backside metal layers 270-1, 270-2 (individually or combination referred to as backside metal layer(s) 270) are formed in the backside dielectric 225.

The 3DIC 200 also includes a through-silicon-via 250 formed in the frontside dielectric 220 and the BOX layer 215. As seen, the through-silicon-via 250 contacts the first frontside metal layer 260-1, extends through the frontside dielectric 220 and the BOX layer 215, and contacts the first backside metal layer 270-1.

The size of the TSV 250 is still large. For example, the width and height of the TSV 250 can be ~0.5 um and ~0.3 um, respectively. The large size of the TSV 250 can put stress on nearby devices. Also, the density of the TSVs is reduced due to the large size. This means that the wiring options are limited. Also, aligning the TSV 250 with the first frontside metal layer 260-1 and/or aligning the TSV 250 with the first backside metal layer 270-1 can become an issue.

To address one or more issues of the conventional 3DICs, it is proposed to provide a self-aligned contact module for TSVs that enables much smaller and denser TSVs with much lower stress. The proposed TSVs are fully compatible with standard fabrication (e.g., complementary metal-oxide-semiconductor (CMOS) technologies).

Figure 3:
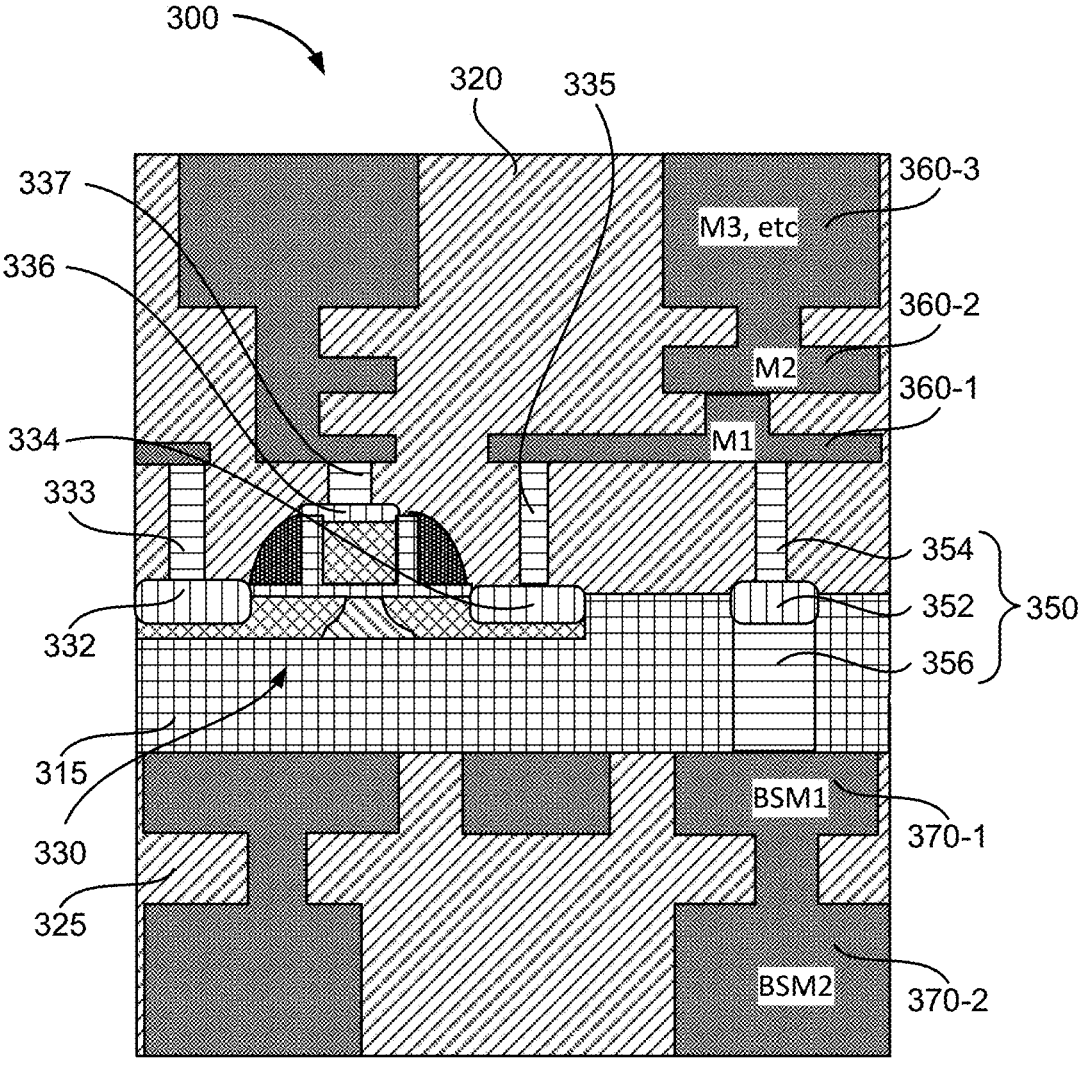
FIG. 3 illustrates an example of an integrated circuit structure in accordance with one or more aspects of the disclosure.

FIG. 3 illustrates an example of an integrated circuit (IC) structure in accordance with one or more aspects of the disclosure. A 3DIC may be an example of the integrated circuit structure 300 illustrated in FIG. 3. While an SOI structure is illustrated, it should be noted that the concepts described herein are not limited thereto.

The IC structure 300 may include a substrate 315 and a frontside insulation 320 on a front surface of the substrate 315. The substrate 315 may be a buried oxide (BOX) layer, and the frontside insulation 320 may be a dielectric. The front surface of the substrate 315 may be the surface where active devices (e.g., transistors) are located. In FIG. 3, the upper surface of the substrate 315 may be referred to as the front surface. The lower surface of the substrate 315 may be viewed as the back surface.

Surfaces of other elements such as the frontside insulation 320 may be in the same orientation. That is, the upper and lower surfaces of the frontside insulation 320 may be referred to as frontside and backside surfaces, respectively. Thus, in this instance, the backside surface of the frontside insulation 320 may be on or in contact with the front surface of the substrate 315.

A transistor 330 may be formed on the substrate 315 and in the frontside insulation 320. A source connect 332 may be electrically coupled with a source of the transistor 330. For example, the source connect 332 may be formed in and/or be in physical contact with the source of the transistor 330. A drain connect 334 may be electrically coupled with a drain of the transistor 330. For example, the drain connect 334 may be formed in and/or be in physical contact with the drain of the transistor 330. A gate connect 336 may be electrically coupled with a gate of the transistor 330. For example, the gate connect 336 may be in physical contact with the gate of the transistor 330. The source connect 332, the drain connect 334, and/or the gate connect 336 may be formed from silicide.

A source contact 333, a drain contact 335, and a gate contact 337 may be formed in the frontside insulation 320. The source contact 333 may be electrically coupled with the source of the transistor 330. For example, the source contact 333 may be in physical contact with the source connect 332. The drain contact 335 may be electrically coupled with the drain of the transistor 330. For example, the drain contact 335 may be in physical contact with the drain connect 334. The gate contact 337 may be electrically coupled with the gate of the transistor 330. For example, the gate contact 337 may be in physical contact with the gate connect 336.

One or more frontside metal layers 360 may be formed in the frontside insulation 320. In FIG. 3, three frontside metal layers 360-1, 360-2, 360-3 are illustrated. However, there can be any number of frontside metal layers 360. At least one frontside metal layer 360 may be electrically coupled to the transistor 330. For example, one or more frontside metal layers 360 may be in contact with any one or more of the source contact 333, the drain contact 335, and the gate contact 337. The frontside metal layers 360 may be formed from one or more metals including one or more of tungsten (W), copper (Cu), aluminum (Al), cobalt (Co), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), ruthenium (Ru), etc.

The IC structure 300 may include a through-substrate-via 350 formed in the substrate 315 and in the frontside insulation 320. The TSV 350 may comprise a frontside contact 354 and a backside contact 356. The frontside contact 354 may be formed in the frontside insulation 320, and the backside contact 356 may be formed in the substrate 315. The frontside contact 354 and/or the backside contact 356 may be formed from metals including any one or more of W, Cu, Al, Co, Pd, Ni, Au, Ta, TaN, Ti, TiN, Bi, Sb, Mo, Ru, etc. In an aspect, the frontside contact 354 and/or the backside contact 356 may be formed from same materials as the source contact 333, the drain contact 335, and the gate contact 337.

The backside contact 356 may extend from the back surface of the substrate 315 towards the front surface of the substrate 315. Also, a back surface of the backside contact 356 may be coplanar with the back surface of the substrate 315. That is, the backside contact 356 may be exposed at the back surface of the substrate 315.

The frontside and the backside contacts 354, 356 may be electrically coupled with each other. For example, the TSV 350 may also comprise a through-connect 352 in between (physically and/or electrically) the frontside and the backside contacts 354, 356. In particular, the front surface of the through-connect 352 may be in physical contact with the back surface of the frontside contact 354. Also, the back surface of the through-connect 352 may be in physical contact with a front surface of the backside contact 356. The through-connect 352 may be partially in the frontside insulation 320 and partially in the substrate 315. The through-connect 352 may be formed from the same material as the source connect 332, the drain connect 334, and the gate connect 336. For example, the through-connect 352 may be formed from silicide.

The sizes of the frontside and the backside contacts 354, 356 may be different. For example, width and height of the frontside contact 354 may be 0.05 um and 0.09 um, and the width and height of the backside contact 356 may be 0.1 um and 0.1 um. These values may be typical, but the dimensions are not limited to these values. It is thus seen that the TSV 350 is much smaller than the conventional TSV 150, 250 of FIGS. 1 and 2. This can result in much denser TSVs 350, which is desirable. Note that in an aspect, the width of the frontside contact 354 may be narrower than the width of the backside contact 356.

The IC structure 300 may further include a backside insulation 325 on the back surface (opposite the front surface) of the substrate 315. The backside insulation 325 may be a dielectric. That is, the backside insulation 325 and the frontside insulation 320 may be formed from same materials.

The IC structure 300 may yet include one or more backside metal layers 370 in the backside insulation 325. In FIG. 3, two backside metal layers 370-1, 370-2 are illustrated. However, there can be any number of backside metal layers 370. The backside contact 356 may be electrically coupled with a backside metal layer 370. For example, at least one backside metal layer 370 may be in physical contact with the backside contact 356. The backside metal layers 370 may be formed from same materials as the frontside metal layers 360. That is, the backside metal layers 370 may be formed from any one or more of W, Cu, Al, Co, Pd, Ni, Au, Ta, TaN, Ti, TiN, Bi, Sb, Mo, Ru, etc.

FIGS. 4A-4J illustrate examples of stages of fabricating an integrated circuit structure in accordance with one or more aspects of the disclosure. In this instance, the stages may apply to the fabrication of the IC structure 300.

Figure 4A:
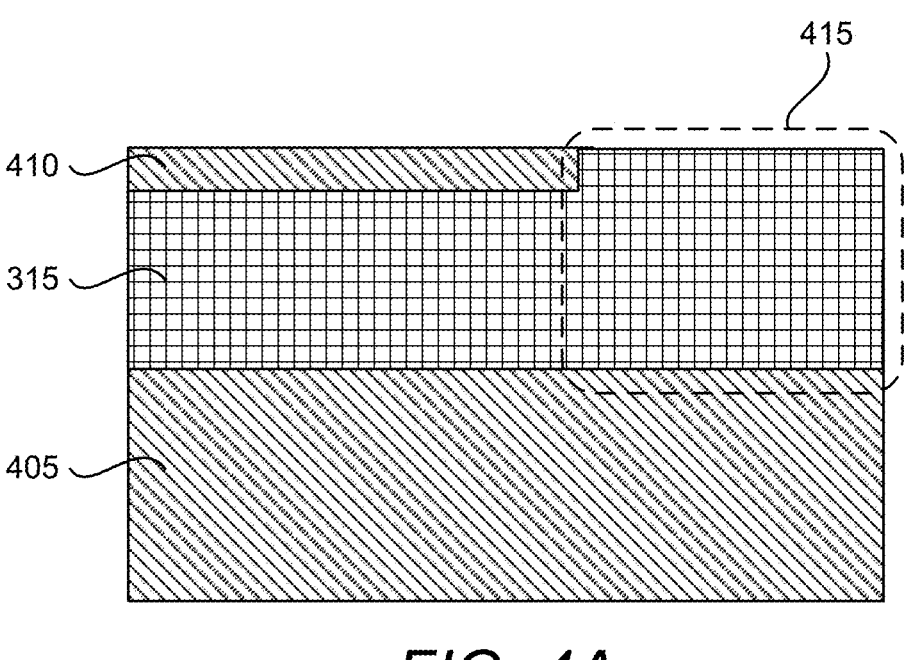
FIGS. 4A-4J illustrate examples of stages of fabricating an integrated circuit structure in accordance with one or more aspects of the disclosure.

FIG. 4A illustrates a stage in which the substrate 315 is provided on a substrate handle 405. In an aspect, the substrate handle 405 may be a silicon substrate. A doped silicon 410 may be formed on the substrate 315 near the front surface thereof. The doped silicon 410 may be lightly doped, e.g., the doping level may be between $10^{12}/cm^3$ and $10^{17}/cm^3$. A shallow trench isolation (STI) region 415 may also be formed in the substrate 315.

Figure 4B:
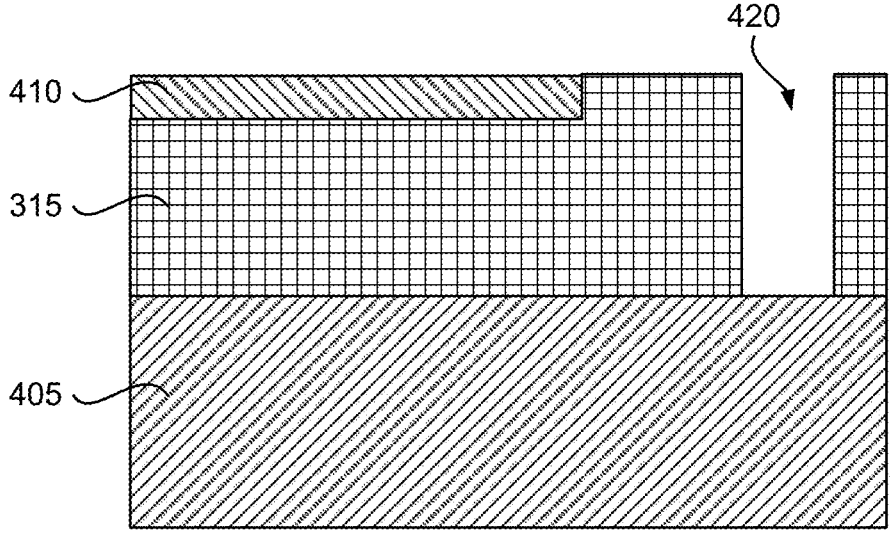

FIG. 4B illustrates a stage in which a trench 420 is formed in the STI region 415 of the substrate 315. In an aspect, the trench 420 may be deep enough to expose the front surface of the substrate handle 405.

Figure 4C:
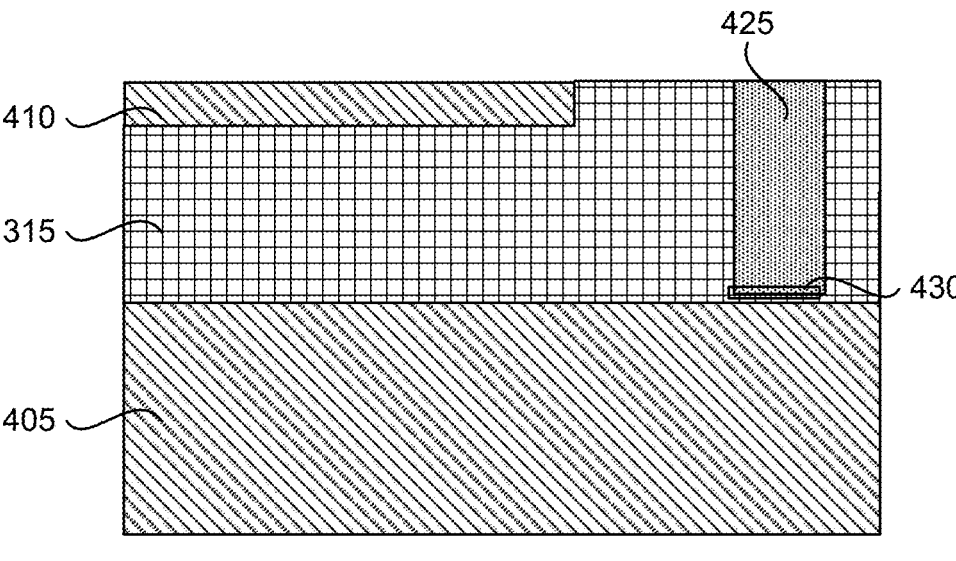

FIG. 4C illustrates a stage in which the trench 420 is partially filled with a trench insulation 430 (e.g., dielectric) on the front surface of the substrate handle 405. Then the remainder of the trench 420 may be filled with a first sacrificial trench fill 425. In an aspect, the first sacrificial trench fill 425 may be a first doped polysilicon, which may be lightly doped polysilicon, again between $10^{12}/cm^3$ and $10^{17}/cm^3$ doping level. The first sacrificial trench fill 425 may then be polished (e.g., through chemical-mechanical polishing (CMP)). After polishing, the front surfaces of the first sacrificial trench fill 425 and the substrate 315 may be coplanar.

Figure 4D:
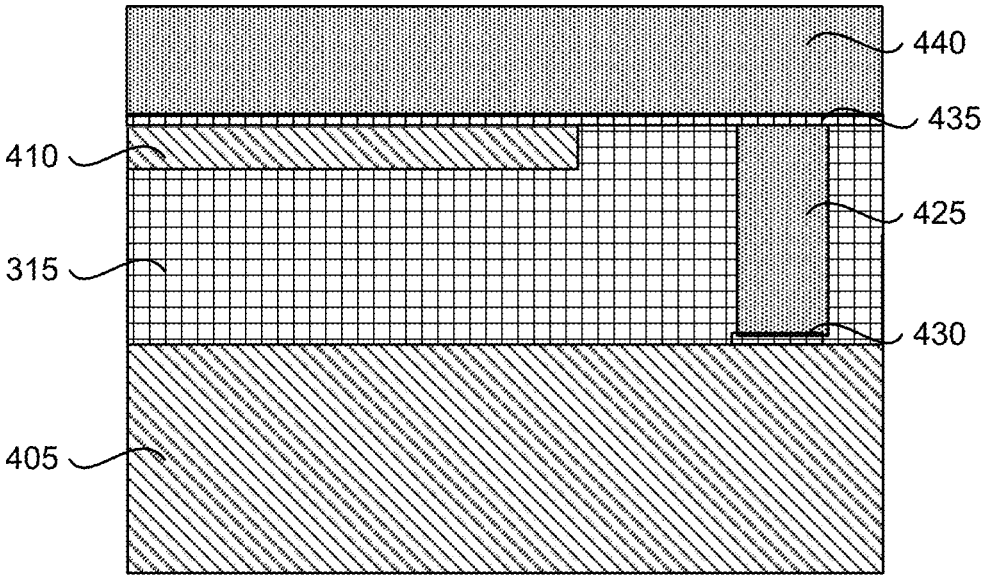

FIG. 4D illustrates a stage in which a gate oxide layer 435 is grown on the front surfaces of the substrate 315, the first sacrificial trench fill 425, and the doped silicon 410. Thereafter, a polysilicon layer 440 may be grown or otherwise formed on a front surface of the gate oxide layer 435. The polysilicon layer 440 may be a second doped polysilicon, which may be lightly doped.

Figure 4E:
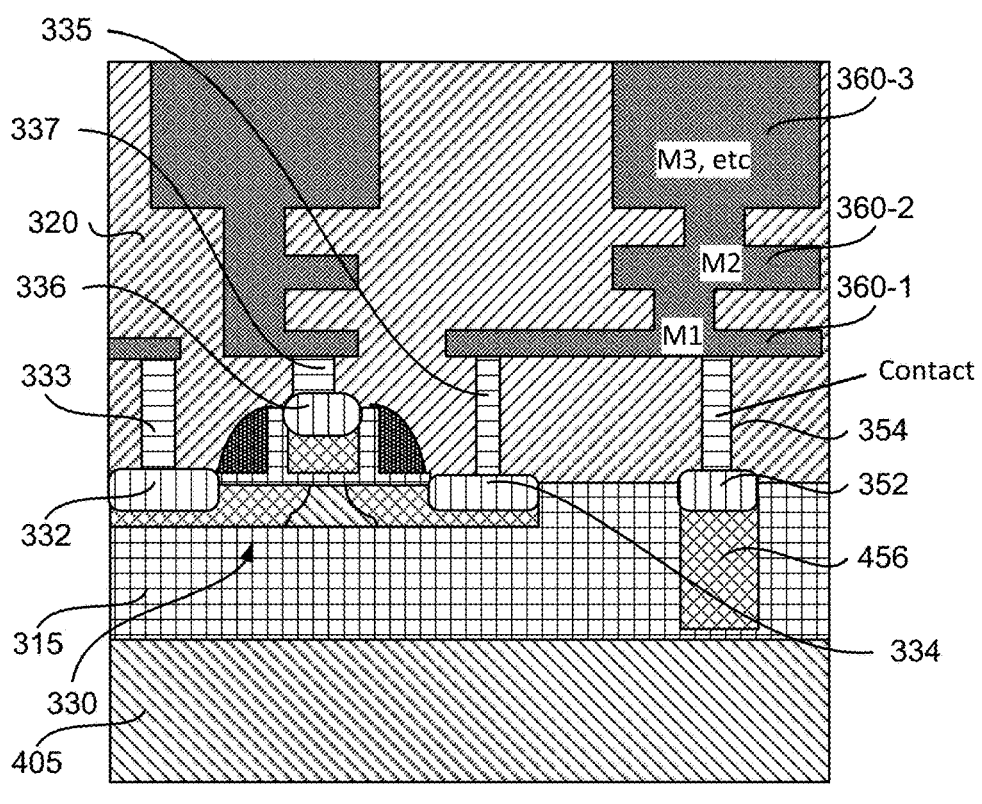

FIG. 4E illustrates a stage in which the transistor 330, the one or more frontside metal layers 360, the frontside contact 354, and the through-connect 352 are formed. This may be accomplished through standard CMOS front-end-of-line (FEOL), middle-of-line (MOL), and back-end-of-line (BEOL) processes. Through the FEOL, MOL, and BEOL processes, the polysilicon layer 440 may be replaced with the frontside insulation 320, the transistor 330, the one or more frontside metal layers 360, the frontside contact 354, and the through-connect 352. Also, the first sacrificial trench fill 425 in the trench 420 may be replaced with a second sacrificial trench fill 456, which may be a third doped silicon or polysilicon, which may be heavily doped, e.g., the doping level may be between $10^{19}/\text{cm}^3$ and $10^{21}/\text{cm}^3$.

Figure 4F:
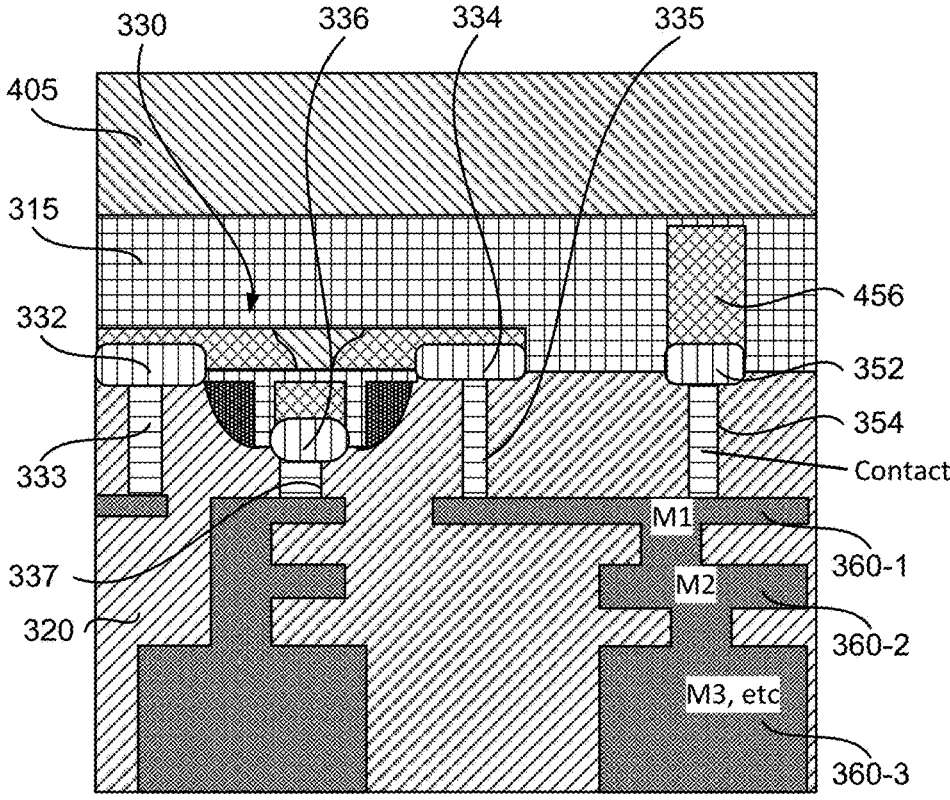

FIG. 4F illustrates a stage in which the IC structure is flipped.

Figure 4G:
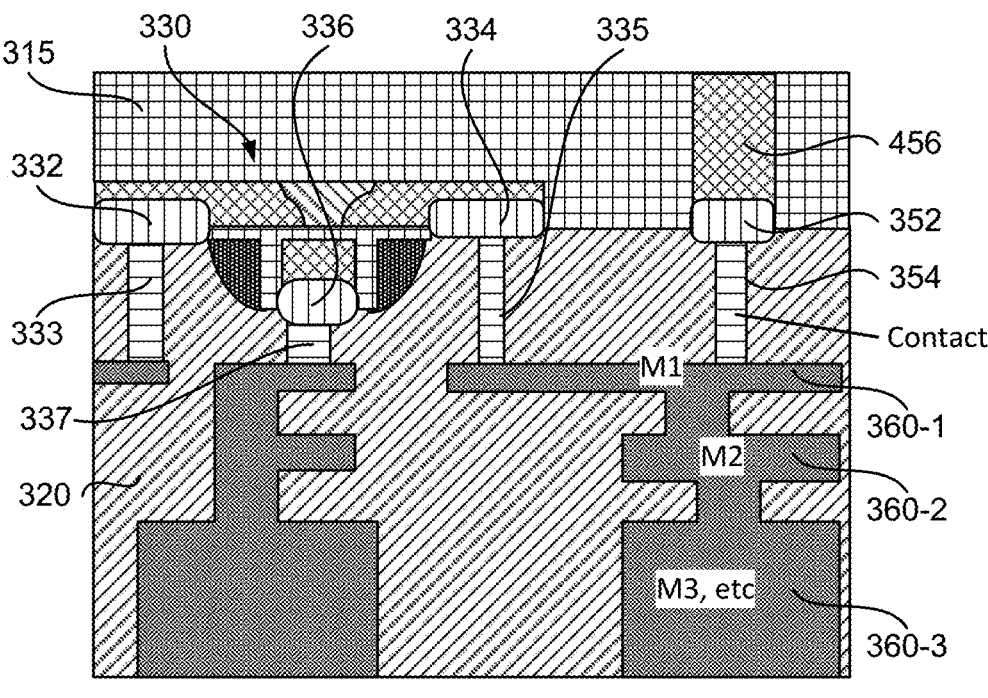

FIG. 4G illustrates a stage in which the substrate handle 405, the trench insulation 430, and a portion of the substrate 315 are removed, e.g., through grinding and/or etching.

After the removing, the second sacrificial trench fill 456 may be exposed.

Figure 4H:
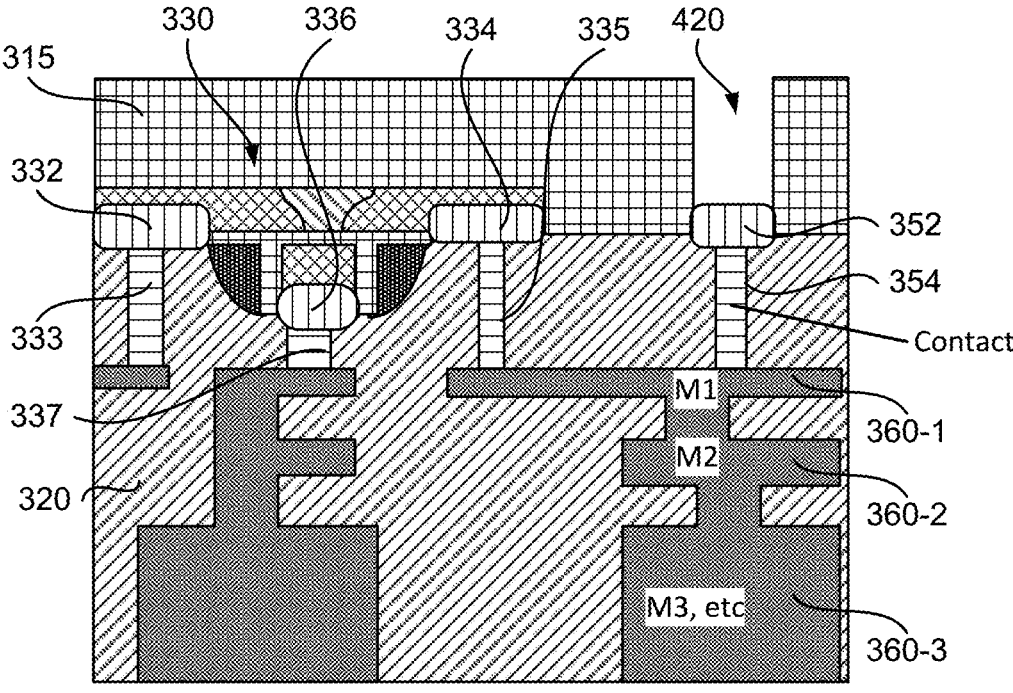

FIG. 4H illustrates a stage in which the second sacrificial trench fill 456 is removed from the trench 420 through selective etching. Because selective etchant is used, there is no need to use a mask. After the selective etching, the through-connect 352 may be exposed.

Figure 4I:
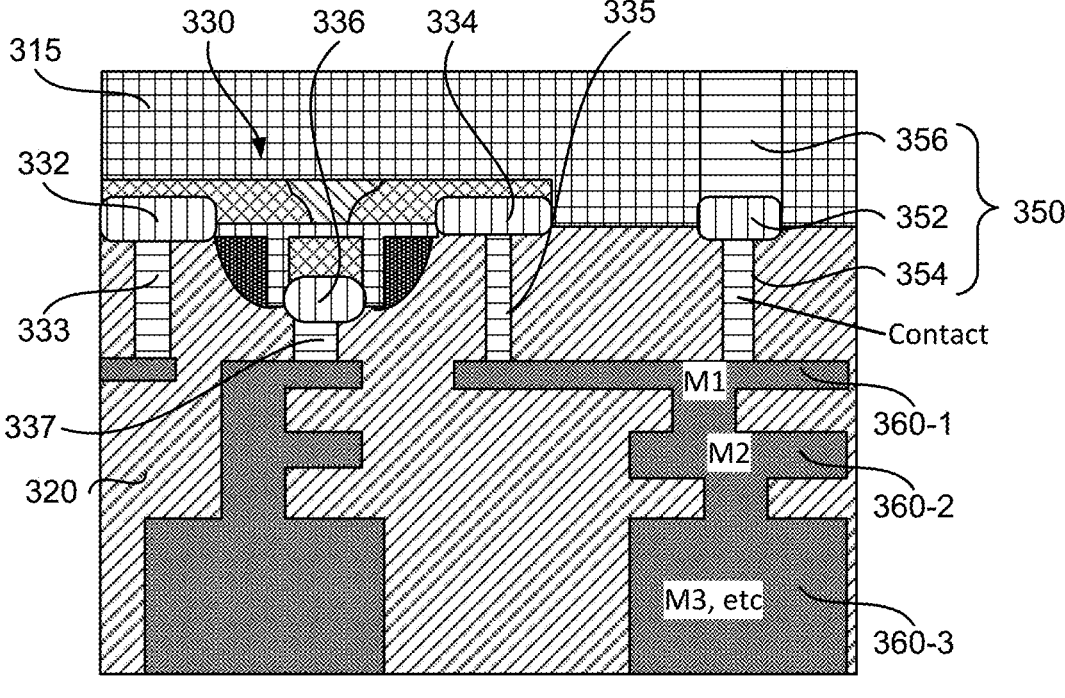

FIG. 4I illustrates a stage in which the trench 420 may be filed with metal to form the backside contact 356. Thereafter, the backside contact 356 may be polished (e.g., through CMP) so that the back surfaces of the substrate 315 and the backside contact 356 are coplanar. The backside contact 356 may be used as an alignment mark for forming backside metal layers 370.

Figure 4J:
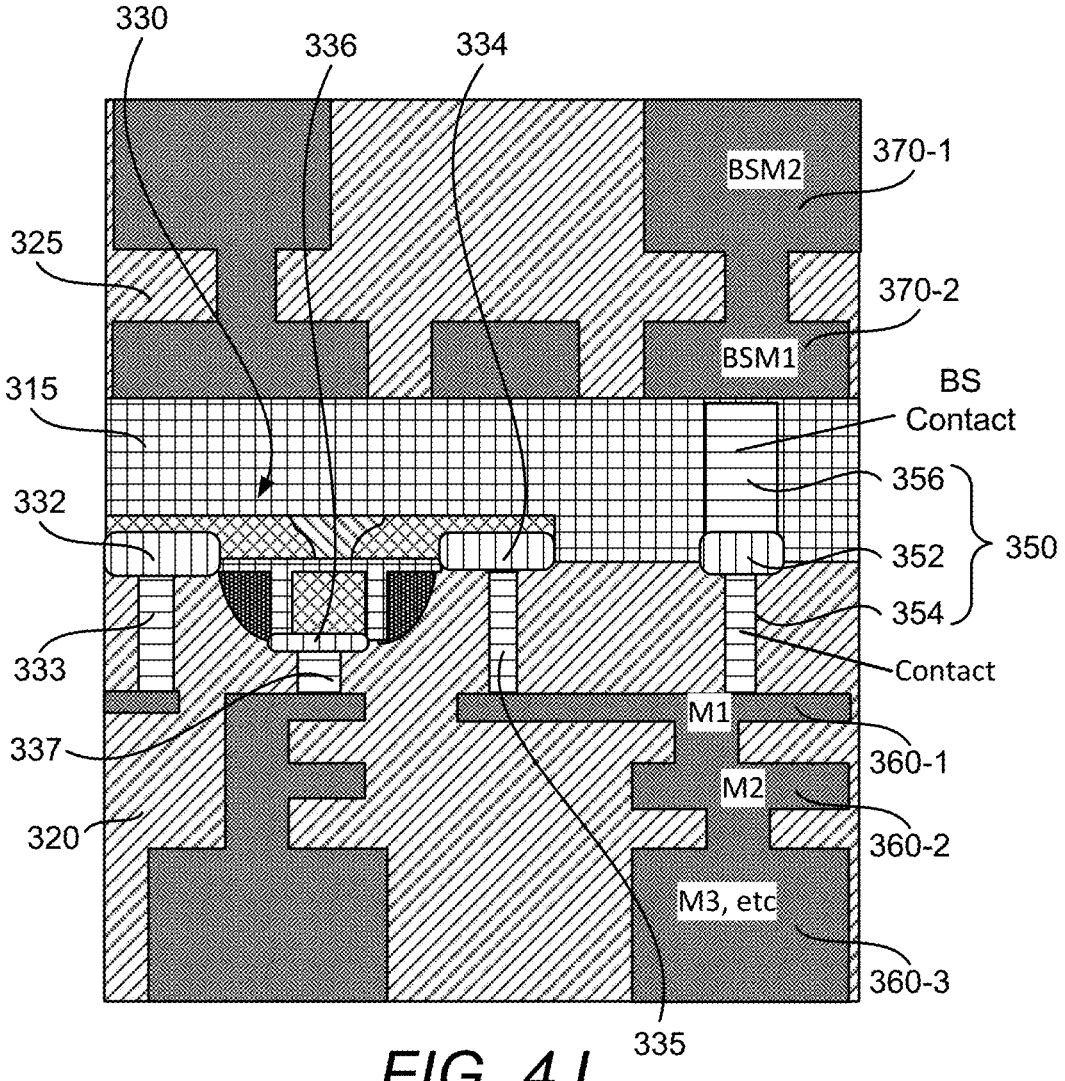

FIG. 4J illustrates a stage in which the backside insulation 325 and the backside metal layers 370 are formed.

FIG. 5 illustrates a flow chart of an example method 500 of manufacturing an integrated circuit structure (e.g., IC structure 300) in accordance with one or more aspects of the disclosure. In block 510, a substrate 315 may be formed.

In block 520, a frontside insulation 320 may be formed on a front surface of the substrate 315.

In block 530, a transistor 330 may be formed on the substrate 315 and in the frontside insulation 320.

In block 540, one or more frontside metal layers 360 may be formed in the frontside insulation 320 on a frontside of the transistor 330. At least one frontside metal layer 360 may be electrically coupled to the transistor 330.

In block 550, a through-substrate-via (TSV) 350 may be formed in the substrate 315 and in the frontside insulation 320. The TSV 350 may comprise a frontside contact 354 in the frontside insulation 320. The frontside contact 354 may be electrically coupled with a frontside metal layer 360. The TSV 350 may also comprise a backside contact 356 in the substrate 315 and electrically coupled with the frontside contact 354.

Figure 6:
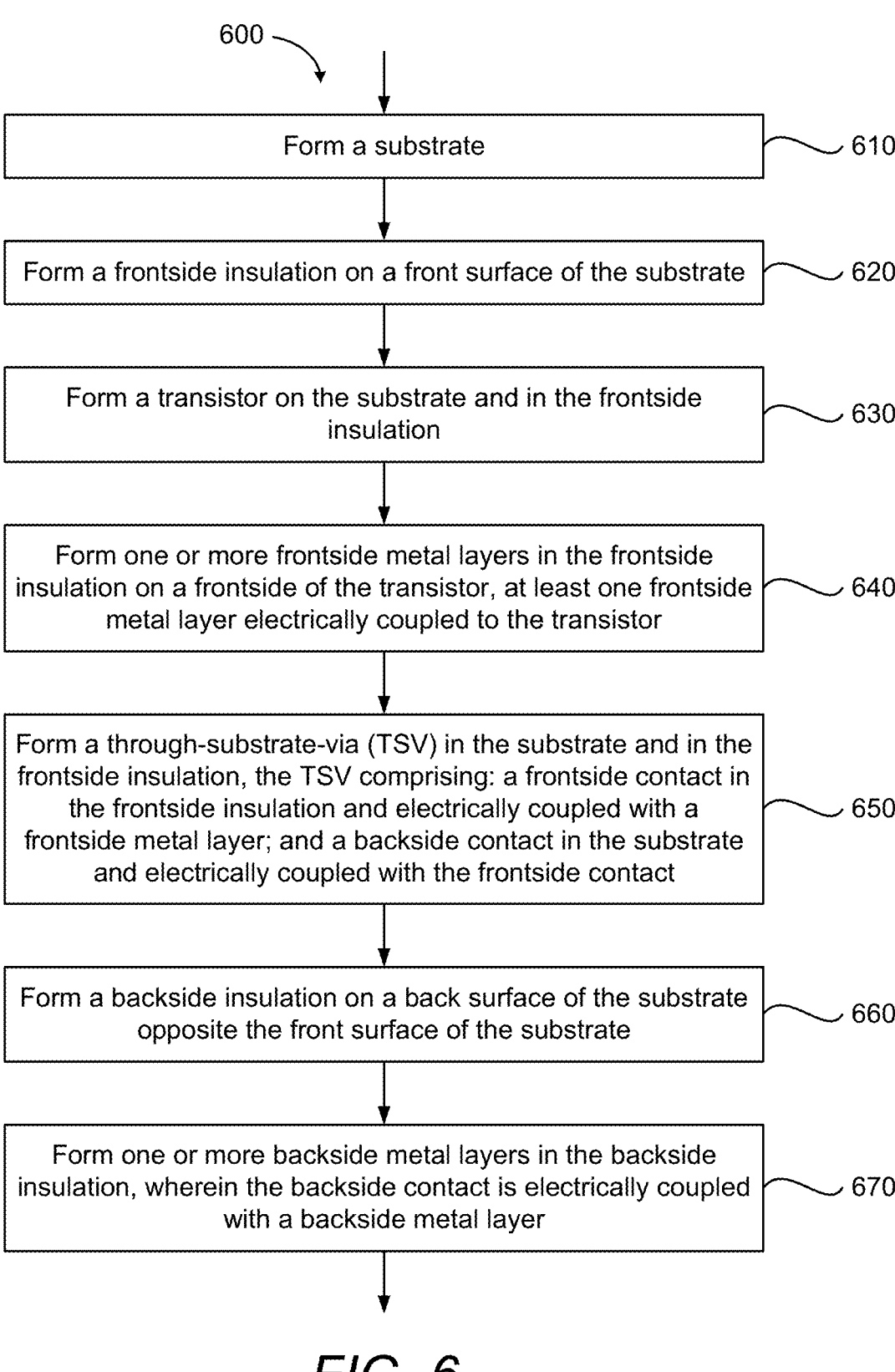

FIG. 6 illustrates a flow chart of an example method 600 of fabricating an integrated circuit structure such as the integrated circuit structure 300 in accordance with one or more aspects of the disclosure. FIG. 6 may be view as being more comprehensive than FIG. 5. Thus, blocks 610-650 may be similar to blocks 510-550. Therefore, detailed descriptions of blocks 610-650 will be omitted for sake of brevity.

FIGS. 7A and 7B illustrate a flow chart of an example process to implement blocks 530, 540, 550 of FIG. 5 and blocks 630, 640, 650 of FIG. 6. In block 710, a substrate handle 405 may be provided and the substrate 315 may be provided on a front surface of the substrate handle 405, and a doped silicon 410 may be provided on the substrate 315. Front surfaces of the doped silicon 410 and the substrate 315 may be coplanar. A shallow trench isolation (STI) region 415 may be formed in a portion of the substrate 315 not covered by the doped silicon 410. Block 710 may correspond with the stage illustrated in FIG. 4A.

In block 715, the trench 420 may be etched in the STI region 415 of the substrate 315. The trench 420 may expose a portion of the front surface of the substrate handle 405. Block 715 may correspond with the stage illustrated in FIG. 4B.

In block 720, the trench 420 may be partially filled with the trench insulation 430 on the front surface of the substrate handle 405.

In block 725, a remainder of the trench 420 may be filled with the first sacrificial trench fill 425.

In block 730 the first sacrificial trench fill 425 may be polished. The front surface of the first sacrificial trench fill 425 may be coplanar with the front surface of the substrate 315 after the polishing. Blocks 720, 725, 730 may correspond with the stage illustrated in FIG. 4C.

In block 740, the gate oxide layer 435 may be formed on the front surfaces of the substrate 315, the first sacrificial trench fill 425, and the doped silicon 410.

In block 745, the polysilicon layer 440 may be formed on the front surface of the gate oxide layer 435. Blocks 740 and 745 may correspond with the stage illustrated in FIG. 4D.

In block 750, the transistor 330, the one or more frontside metal layers 360, the frontside contact 354, and the through-connect 352 may be formed, e.g., through standard CMOS FEOL, MOL, and BEOL processes. The polysilicon layer 440 may be replaced with the frontside insulation 320, the transistor 330, the one or more frontside metal layers 360, the frontside contact 354, and the through-connect 352. Also, the first sacrificial trench fill 425 in the trench 420 may be replaced with the second sacrificial trench fill 456. Block 750 may correspond with the stage illustrated in FIG. 4E.

In block 755, the IC structure 300 may be flipped. Block 755 may correspond with the stage illustrated in FIG. 4F.

In block 760, the substrate handle 405, the trench insulation 430, and a portion of the substrate 315 may be removed. The second sacrificial trench fill 456 may be exposed after the removing. Block 760 may correspond with the stage illustrated in FIG. 4G.

In block 765, the second sacrificial trench fill 456 may be selectively etched from the trench 420. The through-connect 352 may be exposed within the trench 420 after the selective etching. Block 765 may correspond with the stage illustrated in FIG. 4H.

In block 770, the trench 420 may be filled with a metal to form the backside contact 356.

In block 775, the backside contact 356 may be polished, e.g., through CMP. The back surface of the backside contact 356 may be coplanar with the back surface of the substrate 315 after the polishing. Blocks 770, 775 may correspond with the stage illustrated in FIG. 4I.

Referring back to FIG. 6, in block 660, a backside insulation 325 may be formed on the back surface of the substrate 315, which is opposite the front surface of the substrate 315.

In block 670, one or more backside metal layers 370 may be formed in the backside insulation 325. The backside contact 356 may be electrically coupled with a backside metal layer 370. Blocks 660, 670 may correspond with the stage illustrated in FIG. 4J.

It will be appreciated that the foregoing fabrication processes and related discussion are provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations. Further, it will be appreciated that the illustrated configurations and descriptions are provided merely to aid in the explanation of the various aspects disclosed herein. Accordingly, the forgoing illustrative examples and associated figures should not be construed to limit the various aspects disclosed and claimed herein.

Figure 8:
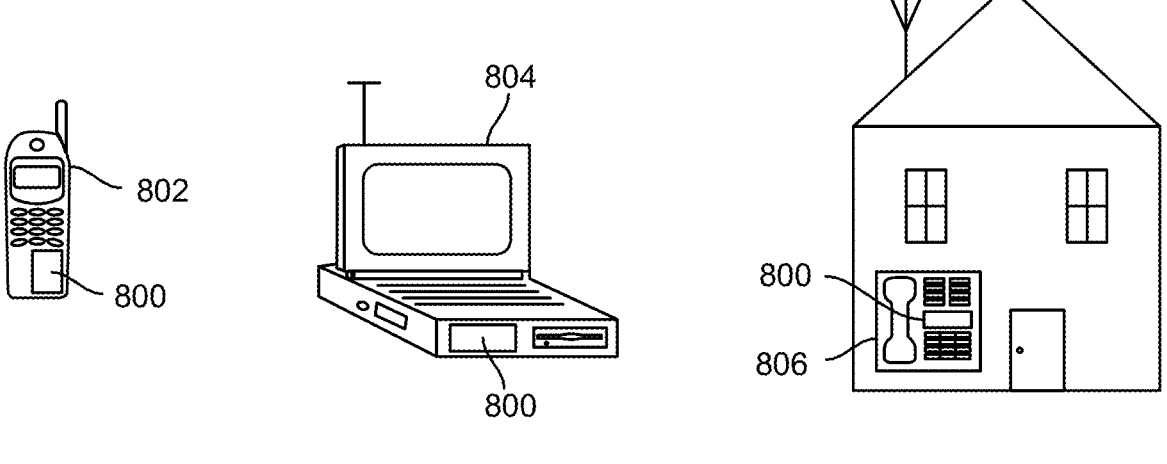
FIG. 8 illustrates various electronic devices which may utilize one or more aspects of the disclosure.

FIG. 8 illustrates various electronic devices 800 that may be integrated with any of the aforementioned devices in accordance with various aspects of the disclosure. For example, a mobile phone device 802, a laptop computer device 804, and a fixed location terminal device 806 may each be considered generally user equipment (UE) and may include electronic devices 800 that include one or more IC structures (e.g., IC structure 300) as described herein. The devices 802, 804, 806 illustrated in FIG. 8 are merely exemplary. Other electronic devices may also include the IC structure including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an IC device. The IC device may then be employed in devices described herein.

Implementation examples are described in the following numbered clauses:

Clause 1: An integrated circuit (IC) structure, comprising: a substrate; a frontside insulation on a front surface of the substrate; a transistor on the substrate and in the frontside insulation; one or more frontside metal layers in the frontside insulation on a frontside of the transistor, at least one frontside metal layer electrically coupled to the transistor; and a through-substrate-via (TSV) in the substrate and in the frontside insulation, the TSV comprising: a frontside contact in the frontside insulation and electrically coupled with a frontside metal layer; and a backside contact in the substrate and electrically coupled with the frontside contact.

Clause 2: The IC structure of clause 1, wherein the frontside contact is formed from one or more of tungsten (W), copper (Cu), aluminum (Al), cobalt (Co), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), and ruthenium (Ru), or wherein the backside contact is formed from one or more of W, Cu, Al, Co, Pd, Ni, Au, Ta, TaN, Ti, TiN, Bi, Sb, Mo, and Ru, or both.

Clause 3: The IC structure of any of clauses 1-2, wherein a width of the frontside contact is narrower than a width of the backside contact.

Clause 4: The IC structure of any of clauses 1-3, wherein the TSV further comprises: a through-connect in between the frontside contact and the backside contact, the through-connect electrically coupling the frontside contact and the backside contact.

Clause 5: The IC structure of clause 4, wherein a front surface of the through-connect is in physical contact with a back surface of the frontside contact, and wherein a back surface of the through-connect is in physical contact with a front surface of the backside contact.

Clause 6: The IC structure of any of clauses 4-5, wherein the through-connect is formed from silicide.

Clause 7: The IC structure of any of clauses 4-6, wherein the through-connect is partially in the frontside insulation and partially in the substrate.

Clause 8: The IC structure of any of clauses 4-7, further comprising: a source connect, a drain connect, a gate connect, or any combination thereof, wherein the source connect is electrically coupled with a source of the transistor, wherein the drain connect is electrically coupled with a drain of the transistor, and wherein the gate connect is electrically coupled with a gate of the transistor.

Clause 9: IC structure of clause 8, wherein any one or more of the source connect, the drain connect, and the gate connect are formed from a same material as the through-connect.

Clause 10: The IC structure of any of clauses 1-9, further comprising: a source contact, a drain contact, a gate contact, or any combination thereof, wherein the source contact is formed in the frontside insulation and is electrically coupled with a source of the transistor, wherein the drain contact is formed in the frontside insulation and is electrically coupled with a drain of the transistor, and wherein the gate contact is formed in the frontside insulation and is electrically coupled with a gate of the transistor.

Clause 11: The IC structure of clause 10, wherein any one or more of the source contact, the drain contact, and the gate contact are formed from same one or more materials of the frontside contact.

Clause 12: The IC structure of any of clauses 1-11, further comprising: a backside insulation on a back surface of the substrate opposite the front surface of the substrate; and one or more backside metal layers in the backside insulation, wherein the backside contact is electrically coupled with a backside metal layer.

Clause 13: The IC structure of clause 12, wherein the backside metal layer is in physical contact with the backside contact.

Clause 14: The IC structure of any of clauses 12-13, wherein the backside insulation is formed from same one or more materials of the frontside insulation, or wherein the one or more backside metal layers are formed from same one or more materials of the one or more frontside metal layers, or both Clause 15: The IC structure of any of clauses 1-14, wherein the substrate comprises a buried oxide (BOX) layer, or wherein the frontside insulation comprises a frontside dielectric layer, or both.

Clause 16: The IC structure of any of clauses 1-15, wherein the backside contact extends from a back surface of the substrate towards the front surface of the substrate.

Clause 17: The IC structure of clause 16, wherein a back surface of the backside contact and the back surface of the substrate are coplanar.

Clause 18: The IC structure of any of clauses 1-17, wherein the one or more frontside metal layers are formed from one or more of tungsten (W), copper (Cu), aluminum (Al), cobalt (Co), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), and ruthenium (Ru).

Clause 19: The IC structure of any of clauses 1-18, wherein the IC structure is a three-dimensional integrated circuit (3DIC).

Clause 20: The IC structure of any of clauses 1-19, wherein the IC structure is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 21: A method of fabricating an integrated circuit (IC) structure, the method comprising: forming a substrate; forming a frontside insulation on a front surface of the substrate; forming a transistor on the substrate and in the frontside insulation; forming one or more frontside metal layers in the frontside insulation on a frontside of the transistor, at least one frontside metal layer electrically coupled to the transistor; and forming a through-substrate-via (TSV) in the substrate and in the frontside insulation, the TSV comprising: a frontside contact in the frontside insulation and electrically coupled with a frontside metal layer; and a backside contact in the substrate and electrically coupled with the frontside contact.

Clause 22: Th method of clause 21, wherein the TSV further comprises: a through-connect in between the frontside contact and the backside contact, the through-connect electrically coupling the frontside contact and the backside contact.

Clause 23: The method of clause 22, wherein forming the transistor, forming the one or more frontside metal layers, and forming the TSV comprise: providing a substrate handle, the substrate on a front surface of the substrate handle, and a doped silicon on the substrate, front surfaces of the doped silicon and the substrate being coplanar; etching a trench in a shallow trench isolation (STI) region of the substrate, the trench exposing a portion of the front surface of the substrate handle; partially filling the trench with a trench insulation on the front surface of the substrate handle; filling a remainder of the trench with a first sacrificial trench fill; polishing the first sacrificial trench fill, wherein a front surface of the first sacrificial trench fill is coplanar with the front surface of the substrate; forming a gate oxide layer on the front surfaces of the substrate, the first sacrificial trench fill, and the doped silicon; forming a polysilicon layer on a front surface of the gate oxide layer; forming the transistor, the one or more frontside metal layers, the frontside contact, and the through-connect, wherein the polysilicon layer is replaced with the frontside insulation, the transistor, the one or more frontside metal layers, the frontside contact, and the through-connect, and wherein the first sacrificial trench fill in the trench is replaced with a second sacrificial trench fill; flipping the IC structure; removing the substrate handle, the trench insulation, and a portion of the substrate, wherein the second sacrificial trench fill is exposed; selectively etching the second sacrificial trench fill from the trench, wherein the through-connect is exposed within the trench; filling the trench with a metal to form the backside contact; and polishing the backside contact, wherein a back surface of the backside contact is coplanar with a back surface of the substrate.

Clause 24: The method of clause 23, wherein the substrate handle is a silicon substrate, wherein the first sacrificial trench fill is a first doped polysilicon, wherein the polysilicon layer is a second doped polysilicon, wherein the second sacrificial trench fill is a third doped polysilicon, wherein the trench insulation is a dielectric, or any combination of the above.

Clause 25: The method of any of clauses 22-24, wherein a front surface of the through-connect is in physical contact with a back surface of the frontside contact, and wherein a back surface of the through-connect is in physical contact with a front surface of the backside contact.

Clause 26: The method of any of clauses 22-25, wherein the frontside contact is formed from one or more of tungsten (W), copper (Cu), aluminum (Al), cobalt (Co), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), and ruthenium (Ru), wherein the backside contact is formed from one or more of W, Cu, Al, Co, Pd, Ni, Au, Ta, TaN, Ti, TiN, Bi, Sb, Mo, and Ru, wherein the through-connect is formed from silicide, or any combination of the above.

Clause 27: The method of any of clauses 21-26, wherein a width of the frontside contact is narrower than a width of the backside contact.

Clause 28: The method of any of clauses 21-27, further comprising: forming a backside insulation on a back surface of the substrate opposite the front surface of the substrate; and forming one or more backside metal layers in the backside insulation, wherein the backside contact is electrically coupled with a backside metal layer.

Clause 29: The method of clause 28, wherein the backside metal layer is in physical contact with the backside contact.

Clause 30: The method of any of clauses 28-29, wherein the backside contact is used as an alignment mark when forming the one or more backside metal layers.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An integrated circuit (IC) structure, comprising:
a substrate;
a frontside insulation on a front surface of the substrate;
a transistor on the substrate and in the frontside insulation;
one or more frontside metal layers in the frontside insulation on a frontside of the transistor, at least one frontside metal layer electrically coupled to the transistor;
a through-substrate-via (TSV) in the substrate and in the frontside insulation, the TSV comprising:
a frontside contact in the frontside insulation and electrically coupled with a frontside metal layer; and a backside contact in the substrate and electrically coupled with the frontside contact;
a backside insulation on the back surface of the substrate opposite the front surface of the substrate; and
one or more backside metal layers in the backside insulation,
wherein a back surface of the backside contact and a back surface of the substrate are coplanar, and
wherein the substrate comprises a buried oxide (BOX) layer.

2. The IC structure of claim 1,
wherein the frontside contact is formed from one or more of tungsten (W), copper (Cu), aluminum (Al), cobalt (Co), palladium (Pd), nickel (Ni), gold (Au), tantalum (Ta), tantalum nitride (TaN), titanium (Ti), titanium nitride (TiN), bismuth (Bi), antimony (Sb), molybdenum (Mo), and ruthenium (Ru), or
wherein the backside contact is formed from one or more of W, Cu, Al, Co, Pd, Ni, Au, Ta, TaN, Ti, TiN, Bi, Sb, Mo, and Ru, or
both.

3. The IC structure of claim 1, wherein a width of the frontside contact is narrower than a width of the backside contact.

4. The IC structure of claim 1, wherein the TSV further comprises:
a through-connect in between the frontside contact and the backside contact, the through-connect electrically coupling the frontside contact and the backside contact.

5. The IC structure of claim 4,
wherein a front surface of the through-connect is in physical contact with a back surface of the frontside contact, and
wherein a back surface of the through-connect is in physical contact with a front surface of the backside contact.

6. The IC structure of claim 4, wherein the through-connect is formed from silicide.

7. The IC structure of claim 4, wherein the through-connect is partially in the frontside insulation and partially in the substrate.

8. The IC structure of claim 4, further comprising:
a source connect, a drain connect, a gate connect, or any combination thereof,
wherein the source connect is electrically coupled with a source of the transistor,
wherein the drain connect is electrically coupled with a drain of the transistor, and
wherein the gate connect is electrically coupled with a gate of the transistor.

9. The IC structure of claim 8, wherein any one or more of the source connect, the drain connect, and the gate connect are formed from a same material as the through-connect.

10. The IC structure of claim 1, further comprising:
a source contact, a drain contact, a gate contact, or any combination thereof,
wherein the source contact is formed in the frontside insulation and is electrically coupled with a source of the transistor,
wherein the drain contact is formed in the frontside insulation and is electrically coupled with a drain of the transistor, and
wherein the gate contact is formed in the frontside insulation and is electrically coupled with a gate of the transistor.

11. The IC structure of claim 10, wherein any one or more of the source contact, the drain contact, and the gate contact are formed from same one or more materials of the frontside contact.

12. The IC structure of claim 1, wherein the backside metal layer is in physical contact with the backside contact.

13. The IC structure of claim 1, wherein the backside insulation is formed from same one or more materials of the frontside insulation.

14. The IC structure of claim 1, wherein the frontside insulation comprises a frontside dielectric layer.

15. The IC structure of claim 1, wherein the backside contact extends from the back surface of the substrate towards the front surface of the substrate.

16. The IC structure of claim 1, wherein the one or more frontside metal layers are formed from one or more of tungsten (W), aluminum (Al), cobalt (Co), copper (Cu), palladium (Pd), nickel (Ni), gold (Au), tantalum (Ta), tan-talum nitride (TaN), titanium (Ti), titanium nitride (TiN), bismuth (Bi), antimony (Sb), molybdenum (Mo), and ruthenium (Ru).

17. The IC structure of claim 1, wherein the IC structure is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

18. The IC structure of claim 1, wherein the backside contact is formed from a single conductive element in contact with the substrate.

19. The IC structure of claim 1, wherein the frontside contact is in physical contact with a metal line in a first metal layer of the at least one frontside metal layer and is directly coupled to a drain contact or a source contact of the transistor in physical contact with the metal line.

* * * * *